(12) United States Patent
Chun

(10) Patent No.: US 10,719,269 B2
(45) Date of Patent: Jul. 21, 2020

(54) MEMORY CONTROLLER, MEMORY SYSTEM INCLUDING THE MEMORY CONTROLLER, AND METHOD OF OPERATING THE MEMORY CONTROLLER

(71) Applicant: SK hynix Inc., Gyeonggi-do (KR)

(72) Inventor: Dong Yeob Chun, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/042,573

(22) Filed: Jul. 23, 2018

(65) Prior Publication Data

US 2019/0187932 A1 Jun. 20, 2019

(30) Foreign Application Priority Data

Dec. 20, 2017 (KR) .................. 10-2017-0176585

(51) Int. Cl.
*G06F 3/06* (2006.01)
*G06F 11/10* (2006.01)
*G06F 13/38* (2006.01)
*G11C 29/52* (2006.01)

(52) U.S. Cl.
CPC ............ *G06F 3/0659* (2013.01); *G06F 3/061* (2013.01); *G06F 3/0604* (2013.01); *G06F 3/0607* (2013.01); *G06F 3/0619* (2013.01); *G06F 3/0673* (2013.01); *G06F 3/0688* (2013.01); *G06F 11/1048* (2013.01); *G06F 11/1068* (2013.01); *G06F 13/385* (2013.01); *G11C 29/52* (2013.01)

(58) Field of Classification Search
CPC .. G06F 3/0659; G06F 3/0604; G06F 11/1068; G06F 3/0607; G06F 13/385
See application file for complete search history.

(56) References Cited

U.S. PATENT DOCUMENTS

| | | | |
|---|---|---|---|
| 7,657,696 B2 | 2/2010 | Su et al. | |
| 2007/0079080 A1* | 4/2007 | Sanders | ............... G06F 3/0607 711/154 |
| 2013/0103889 A1 | 4/2013 | Jeong | |
| 2016/0259675 A1* | 9/2016 | Ninose | .................. G11C 29/76 |
| 2018/0075902 A1* | 3/2018 | Shirakawa | ........... G06F 11/1068 |

* cited by examiner

*Primary Examiner* — Joseph D Torres
(74) *Attorney, Agent, or Firm* — IP & T Group LLP

(57) ABSTRACT

There are provided a memory controller, a memory system including the memory controller, and a method of operating the memory controller. In a memory controller for accessing a plurality of memories in response to a request from a host, the memory controller includes: a processor for generating a command set, based on command generation information of a selected memory among the plurality of memories; and a storage circuit for storing command generation information of each of the plurality of memories.

18 Claims, 8 Drawing Sheets

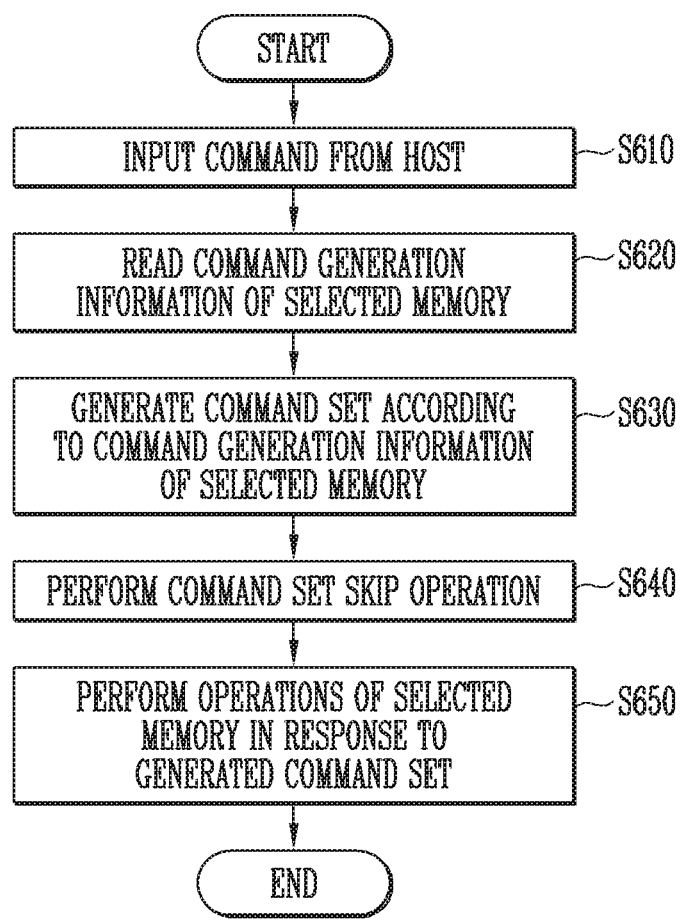

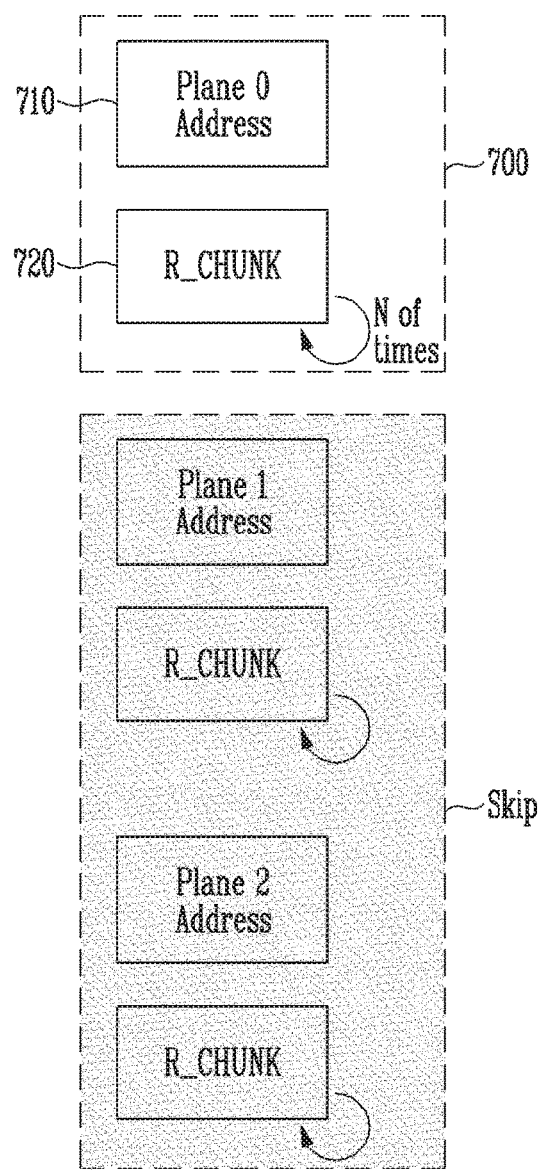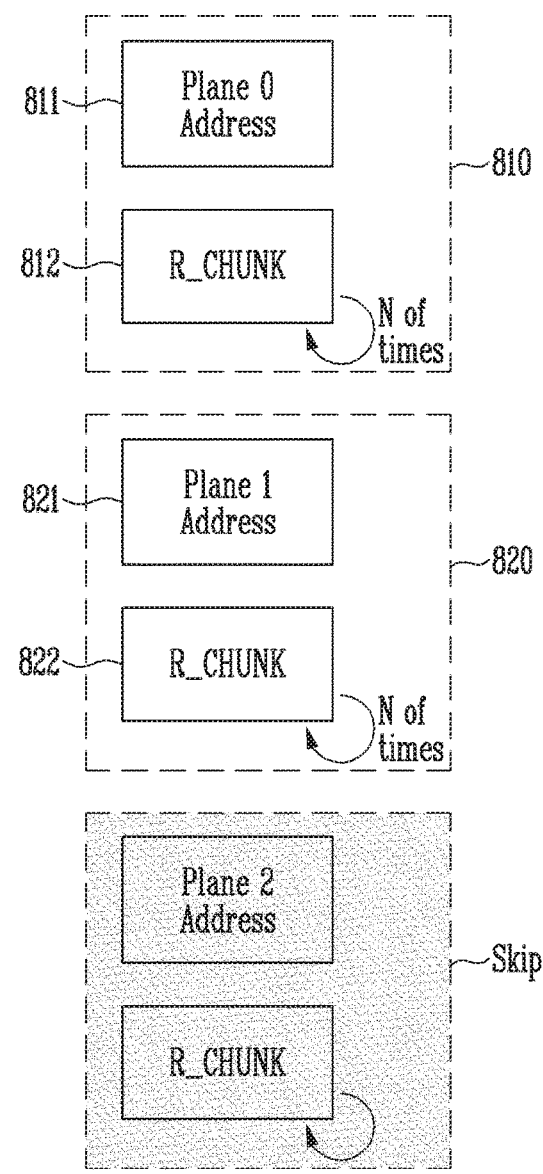

MEMORY CONTROLLER, MEMORY SYSTEM INCLUDING THE MEMORY CONTROLLER, AND METHOD OF OPERATING THE MEMORY CONTROLLER

CROSS-REFERENCE TO RELATED APPLICATION

The present application claims priority under 35 U.S.C. § 119(a) to Korean patent application number 10-2017-0176585, filed on Dec. 20, 2017, which is incorporated herein by reference in its entirety.

BACKGROUND

1. Field of Invention

An aspect of the present disclosure relates generally to an electronic device and, more particularly, to a memory controller, a memory system including the memory controller, and a method of operating the memory controller.

2. Description of the Related Art

The paradigm on recent computer environment has been turned into ubiquitous computing environment in which it is possible to use computing systems anywhere and anytime. This promotes increasing usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. As an example of memory systems having such advantages, the data storage device includes a universal serial bus (USB) memory device, memory cards having various interfaces, a solid-state drive (SSD), and the like.

SUMMARY

Embodiments of the present invention provide a memory controller capable of efficiently managing a command set for controlling a plurality of different memory devices, a memory system including the memory controller, and a method of operating the memory controller.

In accordance with an aspect of the present disclosure, there is provided a memory controller for accessing a plurality of memories in response to a request from a host, the memory controller including: a processor configured to generate a command set, based on command generation information of a selected memory among the plurality of memories; and a storage circuit configured to store command generation information of each of the plurality of memories.

In accordance with another aspect of the present disclosure, there is provided a memory system including: a memory unit including a plurality of memories; and a memory controller configured to control the memory unit by generating a command set for controlling the memory unit in response to a request from a host, wherein the memory controller generates the command set, based on command generation information corresponding to each of the plurality of memories.

In accordance with yet another aspect of the present disclosure, there is provided a method of operating a memory controller, the method including: receiving an external command from a host; acquiring information on an operation requested from the host in response to the received external command; reading command generation information on a selected memory and data unit information; determining a number of times of data command repetition, based on the command generation information and the data unit information; and generating and outputting a command set for controlling the selected memory according to the number of times of data command repetition.

In accordance with another aspect of the present disclosure, there is provided a memory system including: a memory device including planes each having a page; a storage suitable for storing command generation information; and a processor suitable for: generating, in response to a request for one or more target planes among the planes, one or more command sets each including a unit data command for one among the target planes and a repetition number; and controlling the memory device to repeat operations to each target plane by the repetition number according to the unit data command in each command set, wherein the command generation information represents a size of the page, a number of the planes, and a size of unit data for an error correction operation, wherein the processor determines a number of the command sets based on the size of the page and a maximum amount of data that can be processed at a time by the processor, and wherein the processor determines the repetition number based on the size of the page and the size of unit data.

BRIEF DESCRIPTION OF THE DRAWINGS

Example embodiments of the present invention will now be described more fully hereinafter with reference to the accompanying to drawings; however, it is noted that the invention may be embodied in different forms and should not be construed as limited to the embodiments set forth herein. Rather, these embodiments are provided so that the disclosure of the invention will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 6 is a flowchart of a method of operating the memory system in accordance with an embodiment of the present disclosure.

FIGS. 7 and 8 are configuration diagrams illustrating a command set in accordance with an embodiment of the present disclosure.

DETAILED DESCRIPTION

In the following detailed description, only certain exemplary embodiments of the present disclosure have been shown and described, simply by way of illustration. As those skilled in the art would realize, the described embodiments may be modified in various ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is to different disclosure.

In the following description, numerous specific details are set forth in order to provide a thorough understanding of the present invention. The present invention may be practiced without some or all these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1:
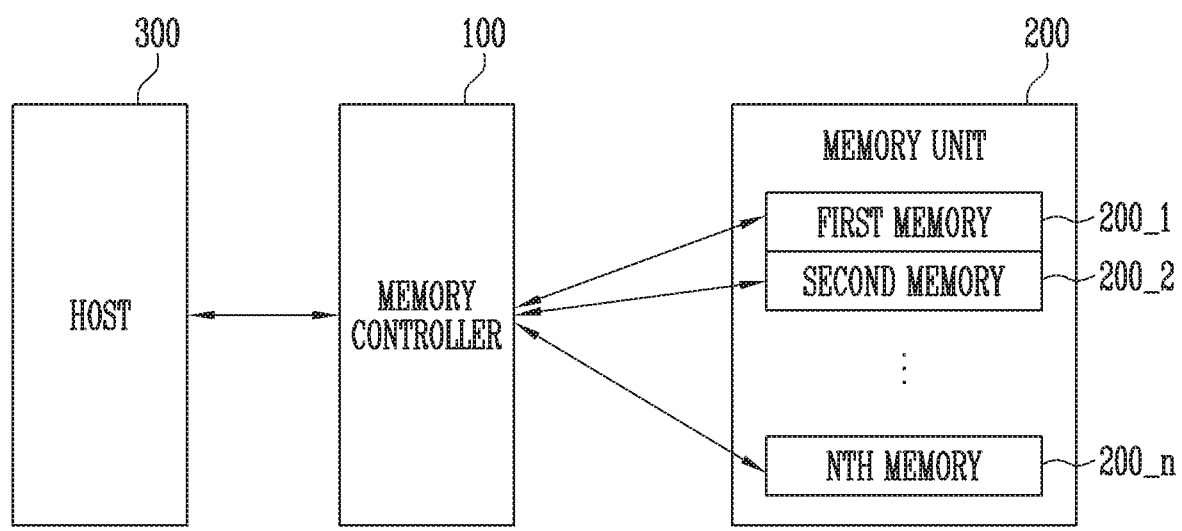
FIG. 1 is a block diagram illustrating a memory system in accordance with an embodiment of the present disclosure.

FIG. 1 is a block diagram illustrating a memory system 1 including a control circuit in accordance with an embodiment of the present disclosure.

Referring to FIG. 1, the memory system 1 may include a memory controller 100, a memory unit 200, and a host 300.

The memory controller 100 is coupled to the host 300 and the memory unit 200. The memory controller 100 is configured to access the memory unit 200 in response to a request from the host 300. For example, the memory controller 100 is configured to control at least one of a read, write, erase, and background operations of the memory unit 200. The memory controller 100 is configured to provide an interface between the memory unit 200 and the host 300. The memory controller 100 is configured to drive firmware for controlling the memory unit 200.

In an embodiment of the present disclosure, the memory controller 100 generates and outputs command sets for controlling a plurality of memories (e.g., first to nth memories 200_1 to 200_n included in the memory unit 200 in response to a request from the host 300. The memory controller 100 generates a common command set according to command generation information (e.g., a page size, a plane number, etc.) on a selected memory among the plurality of memories 200_1 to 200_n. The memory controller 100 may control the plurality of memories 200_1 to 200_n, using the common command set, even when the plurality of memories 200_1 to 200_n have different page sizes, plane numbers, etc.

The memory unit 200 performs the read, write, erase, and background operations under the control of the memory controller 100. That is, the memory unit 200 performs the read, write, erase, and background operations in response to a command set output from the memory controller 100.

The memory unit 200 may be configured to include one or more memories 200_1 to 200_n. The one or more memories 200_1 to 200_n may have different plane numbers, page sizes, etc.

Figure 2:
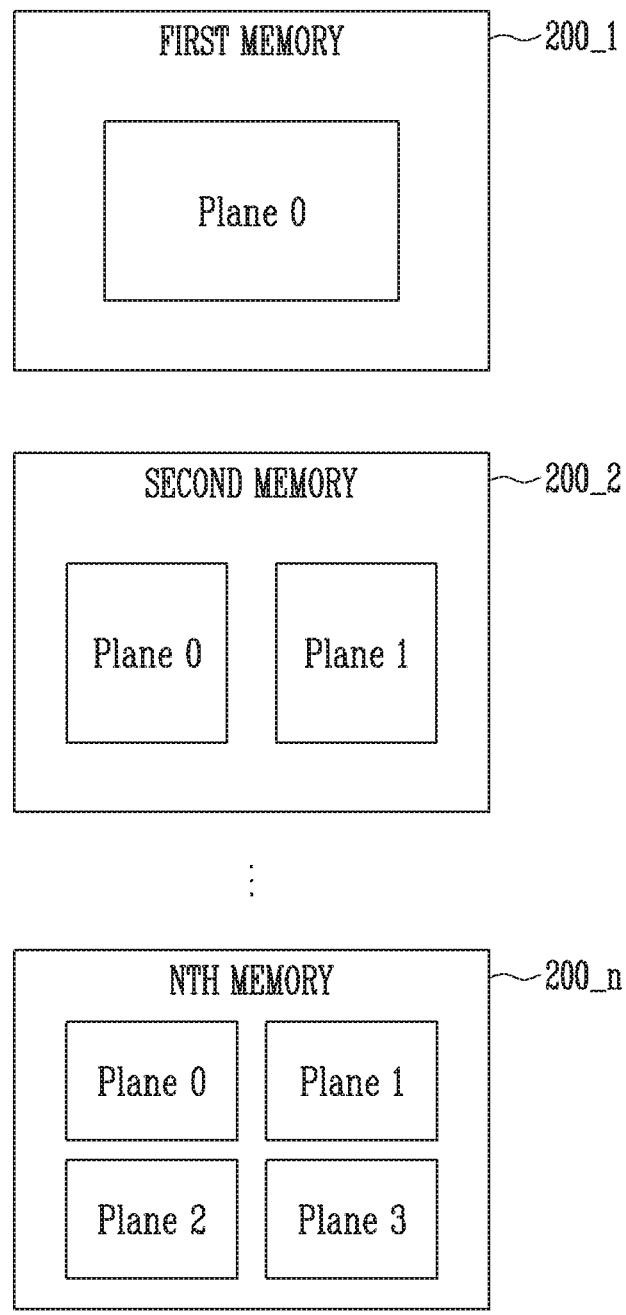
FIG. 2 is a block diagram illustrating a plurality of memories included in a memory unit shown in FIG. 1.

FIG. 2 is a block diagram illustrating a plurality of memories included in the memory unit 200 shown in FIG. 1.

Referring to FIG. 2, the memory unit 200 may be configured to include first to nth memories 200_1 to 200_n.

The first to nth memories 200_1 to 200_n may have different plane numbers. For example, as shown in the drawing, the first memory 200_1 may be configured to include one plane Plane0, the second memory 200_2 may be configured to include two planes Plane0 and Plane 1, and the nth memory 200_n may be configured to include four planes Plane0 to Plane3. In the embodiment of the present disclosure, it is illustrated that the first to nth memories 200_1 to 200_n have different plane numbers. However, the present disclosure is not limited thereto, and each of the first to nth memories 200_1 to 200_n may be configured to include at least one plane. Some memories may be configured to have the same plane number.

Figure 3:
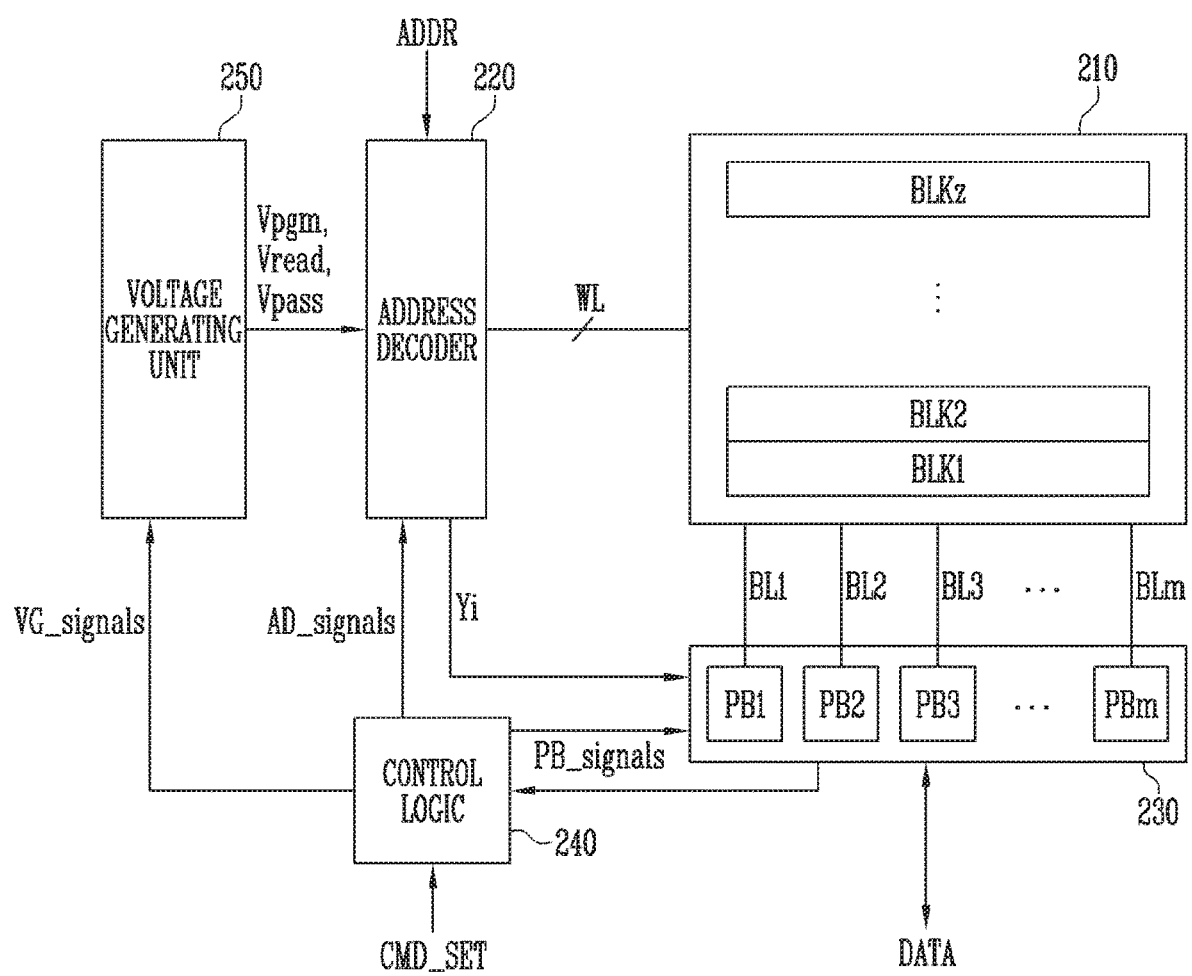
FIG. 3 is a block diagram illustrating an embodiment of a first memory among the plurality of memories included in the memory unit shown in FIG. 1.

FIG. 3 is a block diagram illustrating an embodiment of the first memory 200_1 among the plurality of memories included in the memory unit shown in FIG. 1. The plurality of memories are configured in similar structures.

Referring to FIG. 3, the first memory 200_1 includes a memory cell array 210, an address decoder 220, a read/write circuit 230, a control logic 240, and a voltage generating unit 250.

The address decoder 220, the read/write circuit 230, and the voltage generating unit 250 may be defined as a peripheral circuit for performing overall operations such as program and read operations on the memory cell array 210.

The memory cell array 210 includes a plurality of memory blocks BLK1 to BLKz. The plurality of memory blocks BLK1 to BLKz are coupled to the address decoder 220 through word lines WL. The plurality of memory blocks BLK1 to BLKz are coupled to the read/write circuit 230 through bit lines BL1 to BLm. Each of the plurality of memory blocks BLK1 to BLKz includes a plurality of memory cells. In an embodiment, the plurality of memory cells may be nonvolatile memory cells. In more detail, the plurality of memory cells may be nonvolatile memory cells based on a charge trap device. A plurality of memory cells commonly coupled to the same word line may be defined as one page. The memory cell array 210 is configured with a plurality of pages. In addition, each of the plurality of memory blocks BLK1 to BLKz of the memory cell array 210 includes a plurality of strings. Each of the plurality of strings includes a drain select transistor, a plurality of memory cells, and a source select transistor, which are coupled in series between a bit line and a source line.

The address decoder 220 is coupled to the memory cell array 210 through the word lines WL. The address decoder 220 is configured to operate in response to control signals AD_signals received from the control logic 240. The address decoder 220 receives an address ADDR through an input/output buffer (not shown) provided in the first memory 200_1.

The address decoder 220 applies a program voltage Vpgm and a pass voltage Vpass, which are generated by the voltage generating unit 250 in a program operation, to the plurality of word lines WL of the memory cell array 210, and applies a read voltage Vread and the pass voltage Vpass, which are generated by the voltage generating unit 250 in a read operation, to the plurality of word lines WL of the memory cell array 210.

The program and read operations of the first memory 200_1 may be performed by selecting at least one memory block among the plurality of memory blocks BLK1 to BLKz, and the program and read operations on the selected memory block may be performed in units of pages.

The address ADDR received in the request of the program and read operations includes a block address, a row address, and a column address. The address decoder 220 selects one memory block and one word line according to the block address and the row address. The column address Yi is decoded by the address decoder 220 to be provided to the read/write circuit 230.

The address decoder 220 may include a block decoder, a row decoder, a column decoder, an address buffer, and the like.

The read/write circuit 230 includes a plurality of page buffers PB1 to PBm. The plurality of page buffers PB1 to PBm are coupled to the memory cell array 210 through the bit lines BL1 to BLm. In a program operation, the plurality of page buffers PB1 to PBm temporarily store data DATA inputted through the memory controller 100 of FIG. 1, and control potential levels of corresponding bit lines BL1 to BLm according to the temporarily stored data DATA. That is, the plurality of page buffers PB1 to PBm apply a program permission voltage (e.g., 0 V) or a program prohibition voltage (e.g., VCC) to the corresponding bit lines BL1 to BLm according to the temporarily stored data DATA. The read/write circuit 230 is configured to operate in response to control signals PB_signals output from the control logic 240.

In the read operation, the plurality of page buffers PB1 to PBm perform the read operation by sensing potential levels or current amounts of corresponding bit lines BL1 to BLm, and output read data to the memory controller 100 of FIG. 1.

The control logic 240 is coupled to the address decoder 220, the read/write circuit 230, and the voltage generating unit 250. The control logic 240 receives a command set CMD_SET through the input/output buffer (not shown) of the first memory 200_1. The control logic 240 is configured to control the overall operations of the first memory 200_1 in response to the command set CMD_SET.

The voltage generating unit 250 operates in response to control signals VG_signals output from the control logic 240. For example, in the program operation, the voltage generating unit 250 generates and outputs the program voltage Vpgm and the pass voltage Vpass in response to the control signals VG_signals. In the read operation, the voltage generating unit 250 generates and outputs the read voltage Vread and the pass voltage Vpass in response to the control signals VG_signals.

Figure 4:
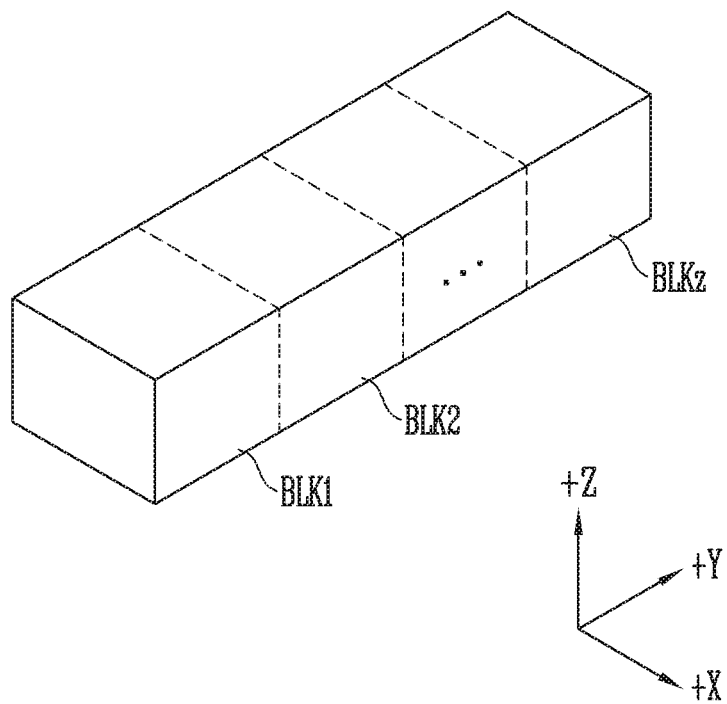
FIG. 4 is a block diagram illustrating an embodiment of a memory cell array shown in FIG. 3.

FIG. 4 is a block diagram illustrating an embodiment of the memory cell array 210 shown in FIG. 3.

Referring to FIG. 4, the memory cell array 210 includes a plurality of memory blocks BLK1 to BLKz. Each memory block may have a three-dimensional structure. Each memory block includes a plurality of memory cells stacked above a substrate. The plurality of memory cells are arranged along +X, +Y, and +Z directions.

Figure 5:
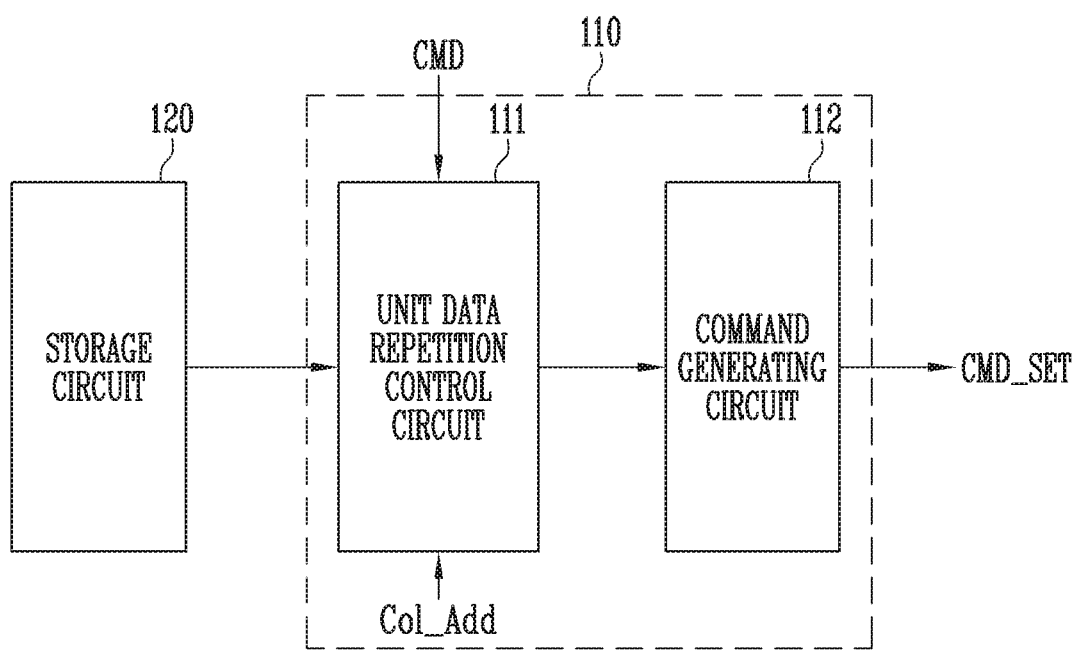
FIG. 5 is a block diagram illustrating an embodiment of a memory controller shown in FIG. 1.

FIG. 5 is a block diagram illustrating an embodiment of the memory controller 100 shown in FIG. 1.

Referring to FIG. 5, the memory controller 100 includes a processor 110 and a storage circuit 120.

The storage circuit 120 stores firmware, and may be used as at least one of a working memory of the processor 110, a cache memory between the memory unit 200 and the host 300 of FIG. 1, and a buffer memory between the memory unit 200 and the host 300. One or more algorithms for performing the overall operations may be stored in the firmware.

Also, the storage circuit 120 may store command generation information on each of the first to nth memories 200_1 to 200_n included in the memory unit 200 of FIG. 1, and store information of data unit (e.g., a chunk) that is a data size for the error correction operation performed at a time by the memory controller 100. The command generation information may include page size information on each of the first to nth memories 200_1 to 200_n, plane number information on each of the first to nth memories 200_1 to 200_n, and the like.

The processor 110 may be configured to include a unit data repetition control circuit 111 and a command generating circuit 112.

The unit data repetition control circuit 111 determines a number of times of unit data command repetition in response to an external command CMD inputted from the host 300, and page size information and plane number information of a selected memory stored in the storage circuit 120, and data unit information, and sets a start address of a command set in response to a column address Col_Add.

As an example, the unit data repetition circuit 111 may determine a storage capacity of the selected memory according to the page size and plane number of the selected memory, and determine a number of times of unit data command repetition by dividing the determined storage capacity by the data unit (e.g., a chunk). The unit data command may be the one for the data unit. The external command CMD may represent a plurality of unit data commands, a number of which corresponds to the number of times of unit data command repetition.

The command generating circuit generates and outputs a command set CMD_SET for controlling the selected memory among the plurality of memories 200_1 to 200_n under the control of the unit data repetition control circuit 111. The command set CMD_SET may include a plane address of the selected memory and a unit data command that is repeated by the determined number of times.

FIG. 6 is a flowchart illustrating a method of operating the memory system 1 in accordance with an embodiment of the present disclosure.

FIGS. 7 and 8 are configuration diagrams illustrating an example of a command set in accordance with an embodiment of the present disclosure.

A method of operating the memory system 1 in accordance with an embodiment of the present disclosure will be described as follows with reference to FIGS. 1 to 8.

An external command CMD from the host 300 is inputted to the memory controller 100 at step S610. When the host 300 requests a write operation, data and an address may be inputted together with the external command CMD. When the host 300 requests a read operation, an address may be inputted together with the external command CMD. The data inputted from the host 300 in the write operation is temporarily stored in the storage circuit 120 of the memory controller 100.

The processor 110 of the memory controller 100 acquires information (e.g., the write/read operation, an ECC type, etc.) on the operation requested from the host 300 in response to the external command CMD, and reads command generation information including page size information, plane number information, and the like on a selected memory stored in the storage circuit 120, data unit information, and the like at step S620.

The unit data repetition control circuit 111 of the processor 110 determines a number of times of unit data command repetition in response to the command generation information including the page size information, the plane number information, and the like on the read selected memory and the data unit information, and sets a start address of a command set CMD_SET in response to a column address Col_Add.

The command generating circuit 112 generates and outputs a command set CMD_SET for controlling the selected memory among the plurality of memories 200_1 to 200_n under the control of the unit data repetition control circuit 111 at step S630.

When outputting the command set CMD_SET, the processor 110 performs a command set skip operation at step S640 such that the command set CMD_SET includes a group of unit data commands for a single plane, which can be identified according to the plane address included in the command set CMD_SET. Due to the command set skip operation, when the external command CMD requires operations to a plurality of target planes, the command set CMD_SET for a single plane may be serviced repeatedly by the target planes in the plane-by-plane manner. Due to the command set skip operation, the command set CMD_SET for a single plane may be serviced in sequence of the target planes. For example, among the plurality of target planes, the command set CMD_SET for a single plane is completely serviced by a first plane and then the command set CMD_SET for a single plane is serviced by a second plane, which is a subsequent to the first plane according to the sequence of the target planes.

Here, the command set CMD_SET for a single plane corresponds to the maximum amount of data that can be processed at a time by the firmware. When a page size of the target planes is beyond the maximum amount of data that can be processed at a time by the firmware, two or more command sets CMD_SETs each for a single plane are generated to cover the page size through the command set skip operation at step S640. For example, when the maximum amount of data that can be processed at a time by the firmware is 8 KB and the page size of the target planes is 16 KB, two command sets CMD_SETs each for a single plane are generated to cover the page size of 16 KB at step S640.

The selected memory included in the memory unit 200 performs overall operations in response to the command set CMD_SET output from the processor 110 at step S650. For example, in response to the command set CMD_SET, the selected memory performs overall operations on the selected plane and continuously performs unperformed overall operations by automatically selecting a next plane when the overall operations on the selected plane are completed. The sequential operations are performed on the plane-by-plane basis at step S650 due to the command set CMD_SET for a single plane output through the command set skip operation, as described with reference to step S640.

FIG. 7 is a configuration diagram illustrating a command set 700 when a selected memory includes three planes, the maximum amount of data that can be processed at a time by the firmware stored in the memory controller 100 is 8 kilobytes (hereinafter, referred to as KB), a page size is 8 KB, and a data unit (e.g., a chunk) is 2 KB.

Referring to FIG. 7, the command set 700 is configured with an address part 710 and a command part 720.

The address part 710 indicates a plane address (e.g., Plane0 Address) corresponding to a start address among the three planes included in the selected memory.

The command part 720 is configured such that a unit data command R_CHUNK is repeatedly performed by a set number N of times. For example, since the page size is 8 KB, the command part 720 is configured such that the unit data command R_CHUNK is repeatedly performed four times when the data unit (e.g., a chunk) is 2 KB.

At this time, the command sets for the other planes Plane1 and Plane2 except a plane (e.g., Plane0) corresponding to the start address among the three planes included in the selected memory, are skipped such that the command set is minimized.

In the step S630, the processor 110 generates a command set 700 corresponding to the plane Plane0. In the step S640, the processor 110 skips command sets corresponding to the other planes Plane1 and Plane2. Accordingly, the command set CMD_SET generated by the processor 110 is minimized.

The memory unit 200 selects the plane Plane0 in response to the address part 710 of the command set 700 and performs overall operations in response to the repeated unit data command R_CHUNK of the command part 720. After this, when the overall operations on the plane Plane0 are completed, the memory unit 200 performs overall operation in response to the repeated unit data command R_CHUNK of the command part 720 by automatically selecting a next plane (e.g., Plane1) under the control of the memory controller 100.

FIG. 8 is a configuration diagram illustrating an example of command set when a selected memory includes three planes, the maximum amount of data that can be processed at a time by the firmware stored in the memory controller 100 is 8 KB, a page size is 16 KB, and a data unit (e.g., a chunk) is 2 KB.

Referring to FIG. 8, the command set includes a first command set 810 and a second command set 820. As described above, when a page size (i.e., 16 KB) of the target planes (i.e., the three planes Plane 0 to Plane 2) is beyond the maximum amount (8 KB) of data that can be processed at a time by the firmware, two or more command sets CMD_SETs (i.e., the first and second command sets 810 and 820) each for a single plane (i.e., each of the two planes Plane 0 and Plane 1) are generated to cover the page size through the command set skip operation at step S640.

The first command set 810 is configured with an address part 811 and a command part 812. The address part 811 indicates a plane address (e.g., Plane 0 Address) corresponding to a first start address among the three planes included in the selected memory. The command part 812 is configured such that a unit data command R_CHUNK is repeatedly performed by a set number N of times. For example, since a size obtained by dividing the entire page size in half is 8 KB, the command part 812 is configured such that the unit data command R_CHUNK is repeatedly performed four times when the data unit (e.g., a chunk) is 2 KB.

The second command set 820 is configured with an address part 821 and a command part 822. The address part 821 indicates a plane address (e.g., Plane 1 Address) corresponding to a next start address among the three planes included in the selected memory. The command part 822 is configured such that a unit data command R_CHUNK is repeatedly performed by a set number N of times. For example, since the size remaining after the processing of the first command set 810 among the entire page size is 8 KB, the command part 822 is configured such that the unit data command R_CHUNK is repeatedly performed four times when the data unit (e.g., a chunk) is 2 KB.

In this case, an address part and a command part, which correspond to the other plane (e.g., Plane2) among the three planes included in the selected memory, are skipped such that the command set is minimized.

In the step S630, the processor 110 generates the command set 810 corresponding to the plane Plane 0 and the command set 820 corresponding to the plane Plane 1. In the step S640, the processor 110 skips a command set corresponding to the other plane Plane 2. Accordingly, the command set CMD_SET generated by the processor 110 is minimized.

The selected memory of the memory unit 200 selects the plane Plane 0 in response to the address part 811 of the first command set 810, and performs overall operations in response to the repeated unit data command R_CHUNK of the command part 812. After this, if the overall operations of the plane Plane 0 are completed, the selected memory of the memory unit 200 selects the plane Plane 1 in response to the address part 821 of the second command set 820, and performs overall operations in response to the repeated unit data command R_CHUNK of the command part 822.

After this, the memory unit 200 performs overall operations in response to the repeated unit data command R_CHUNK of the command part by automatically selecting a next plane (e.g., Plane 2) under the control of the memory controller 100.

Figure 9:
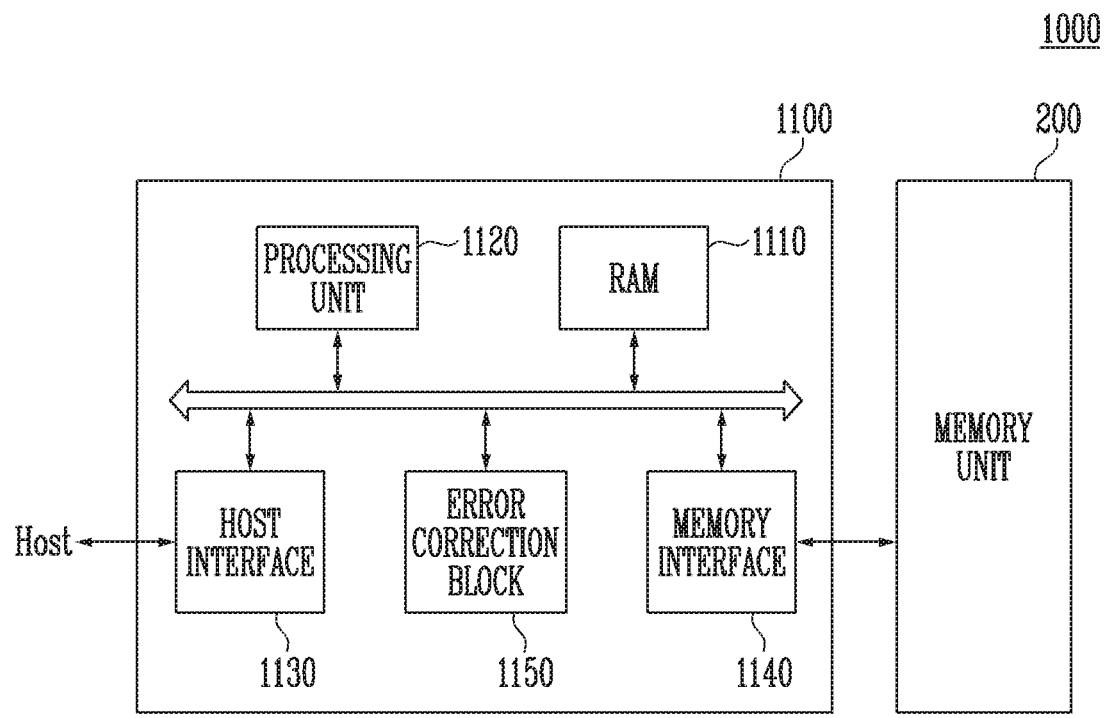
FIG. 9 is a block diagram illustrating another embodiment of the memory system.

FIG. 9 is a block diagram illustrating another embodiment of the memory system.

Referring to FIG. 9, the memory system 1000 includes a memory controller 1100 and a memory unit 200.

The memory unit 200 may be configured and operated identically to the memory unit described with reference to FIGS. 1 and 2. Hereinafter, overlapping descriptions will be omitted.

The memory controller 1100 is coupled to a host Host and the memory unit 200. The memory controller 1100 is configured to access the memory unit 200 in response to a request from the host Host. For example, the memory controller 1100 is configured to control read, write, erase, and background operations of the memory unit 200. The memory controller 1100 is configured to provide an interface between the memory unit 200 and the host Host. The memory controller 1100 is configured to drive firmware for controlling the memory unit 200.

The memory controller 1100 includes a random-access memory (RAM) 1110, a processing unit 1120, a host interface 1130, a memory interface 1140, and an error correction block 1150. The RAM 1110 may correspond to the storage circuit 120 shown in FIG. 5, and the processing unit 1120 may correspond to the processor 110 shown in FIG. 5.

The host interface 1130 includes a protocol for exchanging data between the host Host and the memory controller 1100. In an exemplary embodiment, the memory controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the memory unit 200. For example, the memory interface 1140 may include a NAND interface or a NOR interface.

The error correction block 1150 is configured to detect and correct an error of data received from the memory unit 200 by using an error correction code (ECC). The processing unit 1120 may control the memory unit 200 to adjust a read voltage, based on an error detection result of the error correction block 1150, and to perform re-reading. In an exemplary embodiment, the error correction block 1150 may be provided as a component of the memory controller 1100.

The memory controller 1100 and the memory unit 200 may be integrated into one semiconductor device. In an exemplary embodiment, the memory controller 1100 and the memory unit 200 may be integrated into one semiconductor device, to constitute a memory card. For example, the memory controller 1100 and the memory unit 200 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The memory controller 1100 and the memory unit 200 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the memory unit 200 or the memory system 1000 may be packaged in various forms. For example, the memory unit 200 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), or wafer-level processed stack package (WSP).

Figure 10:
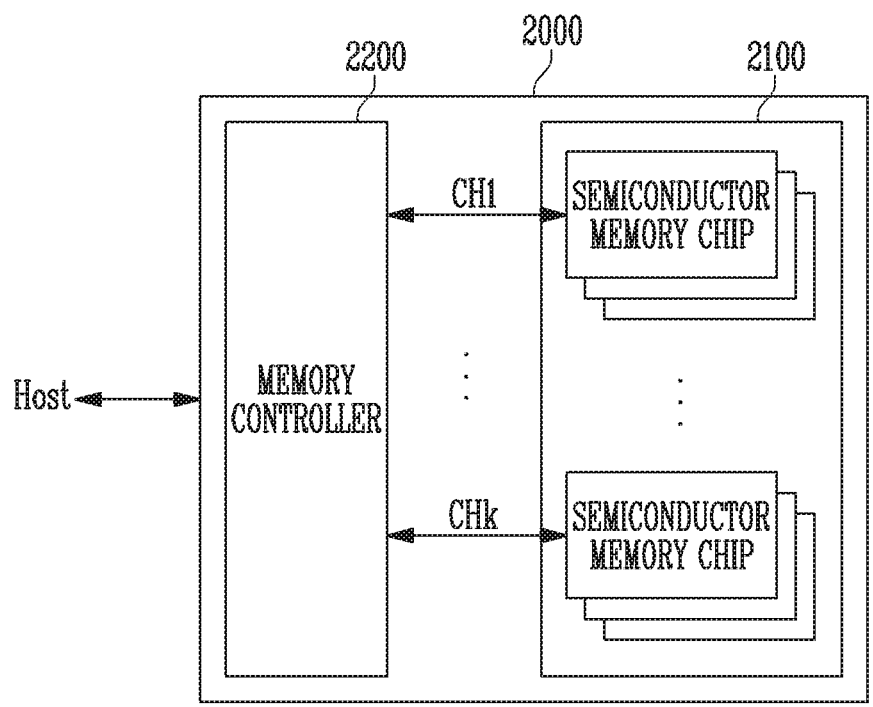
FIG. 10 is a block diagram illustrating an application example of the memory system shown in FIG. 9.

FIG. 10 is a block diagram illustrating an application example of the memory system of FIG. 9.

Referring to FIG. 10, the memory system 2000 includes a semiconductor memory device 2100 and a memory controller 2200. The semiconductor memory device 2100 includes a plurality of semiconductor memory chips. The plurality of semiconductor memory chips are divided into a plurality of groups. The semiconductor memory devices 2100 may correspond to the memory unit 200 of FIG. 1, and the plurality of semiconductor memory chips may correspond to the first to nth memories 200_1 to 200_n of FIG. 1.

In FIG. 10, it is illustrated that the plurality of groups communicate with the memory controller 2200 through first to kth channels CH1 to CHk.

Each group is configured to communicate with the memory controller 2200 through one common channel. The memory controller 2200 is configured identically to the memory controller 1100 described with reference to FIG. 9. The memory controller 2200 is configured to control the plurality of memory chips of the semiconductor memory device 2100 through the plurality of channels CH1 to CHk.

Figure 11:
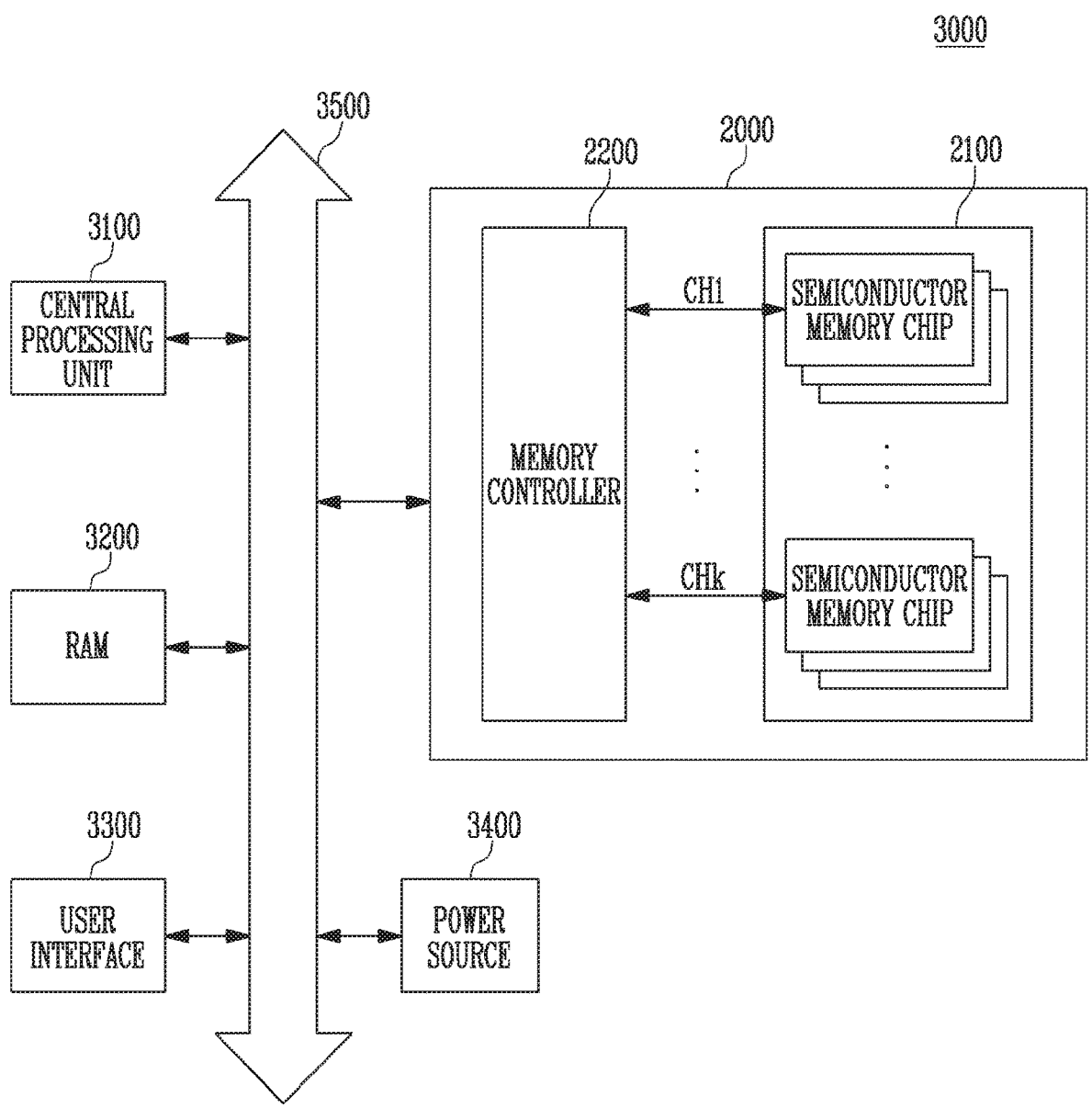
FIG. 11 is a block diagram illustrating a computing system including the memory system described with reference to FIG. 10.

FIG. 11 is a block diagram illustrating a computing system including the memory system described with reference to FIG. 10.

Referring to FIG. 11, the computing system 3000 includes a central processing unit 3100, a RAM 3200, a user interface 3300, a power source 3400, a system bus 3500, and a memory system 2000.

The memory system 2000 is electrically coupled to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 11, it is illustrated that the semiconductor memory device 2100 is coupled to the system bus 3500 through the memory controller 2200. However, the semiconductor memory device 2100 may be directly coupled to the system bus 3500. In this case, the function of the memory controller 2200 may be performed by the central processing unit 3100 and the RAM 3200.

In FIG. 11, it is illustrated that the memory system 2000 described with reference to FIG. 10 is provided. However, the memory system 2000 may be replaced by the memory system 1000 described with reference to FIG. 9. In an exemplary embodiment, the computing system 3000 may be configured to include both the memory systems 1000 and 2000 described with reference to FIGS. 9 and 10.

In accordance with the present disclosure, although a plurality of memory devices included in the memory system are different from one another, a minimum command set capable of integrally controlling the plurality of memory devices is generated, so that commands can be efficiently managed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present disclosure as set forth in the following claims.

What is claimed is:

1. A memory controller for accessing a plurality of memories in response to a request from a host, the memory controller comprising:
   a processor configured to generate a command set, based on command generation information of a selected memory among the plurality of memories; and
   a storage circuit configured to store command generation information of each of the plurality of memories,
   wherein the command generation information includes page size and plane number information of each of the plurality of memories.

2. The memory controller of claim 1, wherein the processor includes:
   a unit data repetition control circuit configured to determine a number of times of unit data command repetition in response to the command generation information stored in the storage circuit and data unit information based on the amount of data that is to be error correction code (ECC)-processed by the memory controller; and
   a command generating circuit configured to generate and output the command set for controlling the selected memory under the control of the unit data repetition control circuit.

3. The memory controller of claim 2, wherein the unit data repetition control circuit sets a start address of the command set in response to a column address.

4. The memory controller of claim 3, wherein the unit data repetition control circuit determines a total storable data size according to the page size and plane number of the selected memory, and determines a number of times of unit data command repetition, based on the data unit information.

5. The memory controller of claim 4, wherein the command generating circuit generates the command set including a plane address based on the start address set by the unit data repetition control circuit and a unit data command repeated by the number of times of unit data command repetition.

6. The memory controller of claim 1, wherein the plurality of memories include plane numbers equal to or different from one another.

7. A memory system comprising:
   a memory unit including a plurality of memories; and
   a memory controller configured to control the memory unit by generating a command set for controlling the memory unit in response to a request from a host,
   wherein the memory controller generates the command set, based on command generation information corresponding to each of the plurality of memories
   wherein the command generation information includes page size and plane number information of each of the plurality of memories.

8. The memory system of claim 7, wherein the memory controller includes a processor configured to generate the command set, based on command generation information of a selected memory among the plurality of memories.

9. The memory system of claim 8, wherein the memory controller further includes a storage circuit configured to store the command generation information of each of the plurality of memories.

10. The memory system of claim 8, wherein the processor includes:

a unit data repetition control circuit configured to determine a number of times of unit data command repetition in response to the command generation information and data unit information; and a command generating circuit configured to generate and output the command set for controlling the selected memory under the control of the unit data repetition control circuit.

11. The memory system of claim 10, wherein the data unit information indicates the amount of data that is to be ECC-processed by the memory controller.

12. The memory system of claim 10, wherein the unit data repetition control circuit sets a start address of the command set in response to a column address.

13. The memory system of claim 12, wherein the unit data repetition control circuit determines a total storable data size according to the page size and plane number of the selected memory, and determines a number of times of unit data command repetition, based on the data unit information.

14. The memory system of claim 13, wherein the command generating circuit generates the command set including a plane address based on the start address set by the unit data repetition control circuit and a unit data command repeated by the number of times of unit data command repetition.

15. The memory system of claim 7, wherein the selected memory among the plurality of memories performs overall operations on a start plane among the one or more planes in response to the command set, and the memory controller controls the selected memory to perform the overall operations by selecting a next plane of the start plane when the overall operations are completed.

16. A method of operating a memory controller, the method comprising:

receiving an external command from a host;

acquiring information on an operation requested from the host in response to the received external command;

reading command generation information on a selected memory and data unit information;

determining a number of times of unit data command repetition, based on the command generation information and the data unit information; and generating and outputting a command set for controlling the selected memory according to the number of times of unit data command repetition.

17. The method of claim 16, wherein, in the generating and outputting of the command set, if overall operations on a selected plane corresponding to a plane address included in the command set among a plurality of planes included in the selected memory are completed, an operation of generating command sets for the other unselected planes except the selected plane is skipped.

18. A memory system comprising:

a memory device including planes each having a page;

a storage suitable for storing command generation information; and a processor suitable for:

generating, in response to a request for one or more target planes among the planes, one or more command sets each including a unit data command for one among the target planes and a repetition number; and controlling the memory device to repeat operations to each target plane by the repetition number according to the unit data command in each command set, wherein the command generation information represents a size of the page, a number of the planes, and a size of unit data for an error correction operation, wherein the processor determines a number of the command sets based on the size of the page and a maximum amount of data that can be processed at a time by the processor, and wherein the processor determines the repetition number based on the size of the page and the size of unit data.

* * * * *